United States Patent
Eltoft (10) Patent No.: US 9,473,093 B2
(45) Date of Patent: Oct. 18, 2016

(54) METHOD AND APPARATUS FOR ULTRASONIC TRIGGERED AUDIO REDUCTION

(71) Applicant: Google Technology Holdings LLC, Mountain View, CA (US)

(72) Inventor: Justin D. Eltoft, Pleasant Prairie, WI (US)

(73) Assignee: Google Technology Holdings LLC, Mountain View, CA (US)

(*) Notice: Subject to any disclaimer, the term of this patent is extended or adjusted under 35 U.S.C. 154(b) by 101 days.

(21) Appl. No.: 14/340,645

(22) Filed: Jul. 25, 2014

(65) Prior Publication Data

US 2016/0028356 A1   Jan. 28, 2016

(51) Int. Cl.
   *H03G 3/00*   (2006.01)
   *H03G 1/02*   (2006.01)
   *G08C 23/02*  (2006.01)
   *H04R 3/00*   (2006.01)
   *H04R 1/10*   (2006.01)

(52) U.S. Cl.
   CPC ............... *H03G 1/02* (2013.01); *G08C 23/02* (2013.01); *H04R 1/1041* (2013.01); *H04R 3/00* (2013.01); *H04R 2430/01* (2013.01)

(58) Field of Classification Search
   CPC .................................. H03G 1/02; H04S 3/00
   USPC ......................................................... 381/105
   See application file for complete search history.

(56) References Cited

U.S. PATENT DOCUMENTS

| | | | |
|---|---|---|---|
| 8,194,865 B2 | 6/2012 | Goldstein et al. | |
| 8,200,249 B2 | 6/2012 | Lipovski | |
| 8,311,228 B2 | 11/2012 | Goldstein et al. | |
| 2005/0111675 A1* | 5/2005 | Lee | H04R 5/04 381/104 |
| 2006/0171515 A1* | 8/2006 | Hintermeister | G06Q 10/10 379/110.01 |
| 2006/0245736 A1* | 11/2006 | Affaki | H04N 5/45 386/235 |
| 2008/0013752 A1* | 1/2008 | Stephens | H03G 5/005 381/103 |
| 2011/0130853 A1* | 6/2011 | Han | H03G 3/3005 700/94 |
| 2013/0039507 A1 | 2/2013 | Park et al. | |

FOREIGN PATENT DOCUMENTS

ES   466725 A1 *  2/1978

OTHER PUBLICATIONS

Hutchings, "Make Mobile Payments Using Ultrasonic Sound", PSFK [online]. Retrieved from the Internet: <http://www.psfk.com/2011/06/make-mobile-payments-with-zoosh-using-ultrasonic-sound.html> Jun. 21, 2011, 2 pgs.

(Continued)

*Primary Examiner* — Simon Sing
(74) *Attorney, Agent, or Firm* — Shumaker & Sieffert, P.A.

(57) ABSTRACT

A method and apparatus trigger audio reduction using an ultrasonic signal. Device audio can be output at a first device audio setting from a device through a headphone coupled to the device. An ultrasonic signal can be received. Device audio volume can be reduced through the headphone to output the device audio at a second device audio setting through the headphone in response to receiving the ultrasonic signal. An external audio signal can be received. The external audio signal can be sent through the headphone in response to receiving the ultrasonic signal.

20 Claims, 7 Drawing Sheets

(56) References Cited

OTHER PUBLICATIONS

Roettgers, "Ultrasonic networking: your devices are talking, and you can't hear a thing", Knowingly, Inc. [online]. Retrieved from the Internet: <https://gigaom.com/2013/08/09/ultrasonic-networking-your-devices-are-talking-and-you-cant-hear-a-thing/> Aug. 9, 2013, 4 pgs.

Theriot, "What is Ducking in Audio Recording?" Home Brew Audio [online]. Retrieved from the Internet: <http://www.homebrewaudio.com/what-is-ducking-in-audio-recording/> Dec. 30, 2011, 3 pgs.

Smus, "Ultrasonic networking on the web", Boris Smus blog [online]. Retrieved from the Internet: <http://smus.com/ultrasonic-networking/> Aug. 8, 2013, 4 pgs.

* cited by examiner

METHOD AND APPARATUS FOR ULTRASONIC TRIGGERED AUDIO REDUCTION

BACKGROUND

1. Field

The present disclosure is directed to a method and apparatus for ultrasonic triggered audio reduction.

2. Introduction

Presently, portable electronic devices include cellular phones, smartphones, tablet computers, MP3 players, and other portable electronic devices that output device audio through headphones for a user. For example, a smartphone device plays music, plays movies, streams music and movies, provides phone call audio, outputs game audio, provides white noise applications that output white noise audio, and provides other audio through headphones. Many of these headphones are in-ear and over-the-ear headphones that provide sound isolation from external noises. The headphones can also employ noise reduction that further blocks external noises.

Unfortunately, the combination of device audio, sound isolation, and noise reduction prevents the user from clearly hearing external audio that is of interest to the user. For example, a user riding a train can listen to device audio using headphones that muffle or block most external audio, including outside noise. The muffled or blocked external audio also includes any public announcements from a public address system on the train. The user may hear some sound from an announcement, but may not bother pausing the audio or taking off their headphones to listen to the announcement. Even if the user does pause the audio or take off the headphones, it may be too late to hear the announcement. This problem also applies to emergency alerts and announcements made on other public address systems. It also applies to emergency vehicle alerts, tornado alerts, and other public alerts that should be heard over the portable device music. If a user misses the external audio alerts, the user may miss their train or bus stop, may not take appropriate action in response to emergency warnings, and will not otherwise timely and appropriately respond to the announcement.

Thus, there is a need for a method and apparatus for ultrasonic triggered audio reduction.

BRIEF DESCRIPTION OF THE DRAWINGS

In order to describe the manner in which advantages and features of the disclosure can be obtained, a description of the disclosure is rendered by reference to specific embodiments thereof which are illustrated in the appended drawings. These drawings depict only example embodiments of the disclosure and are not therefore to be considered to be limiting of its scope.

DETAILED DESCRIPTION

Embodiments provide a method and apparatus that trigger audio reduction using an ultrasonic signal. Device audio can be output from a device at a first device audio setting through a headphone coupled to the device. An ultrasonic signal can be received. Device audio volume can be reduced through the headphone to output the device audio at a second device audio setting through the headphone in response to receiving the ultrasonic signal. An external audio signal can be received. The external audio signal can be sent through the headphone in response to receiving the ultrasonic signal.

Figure 1:
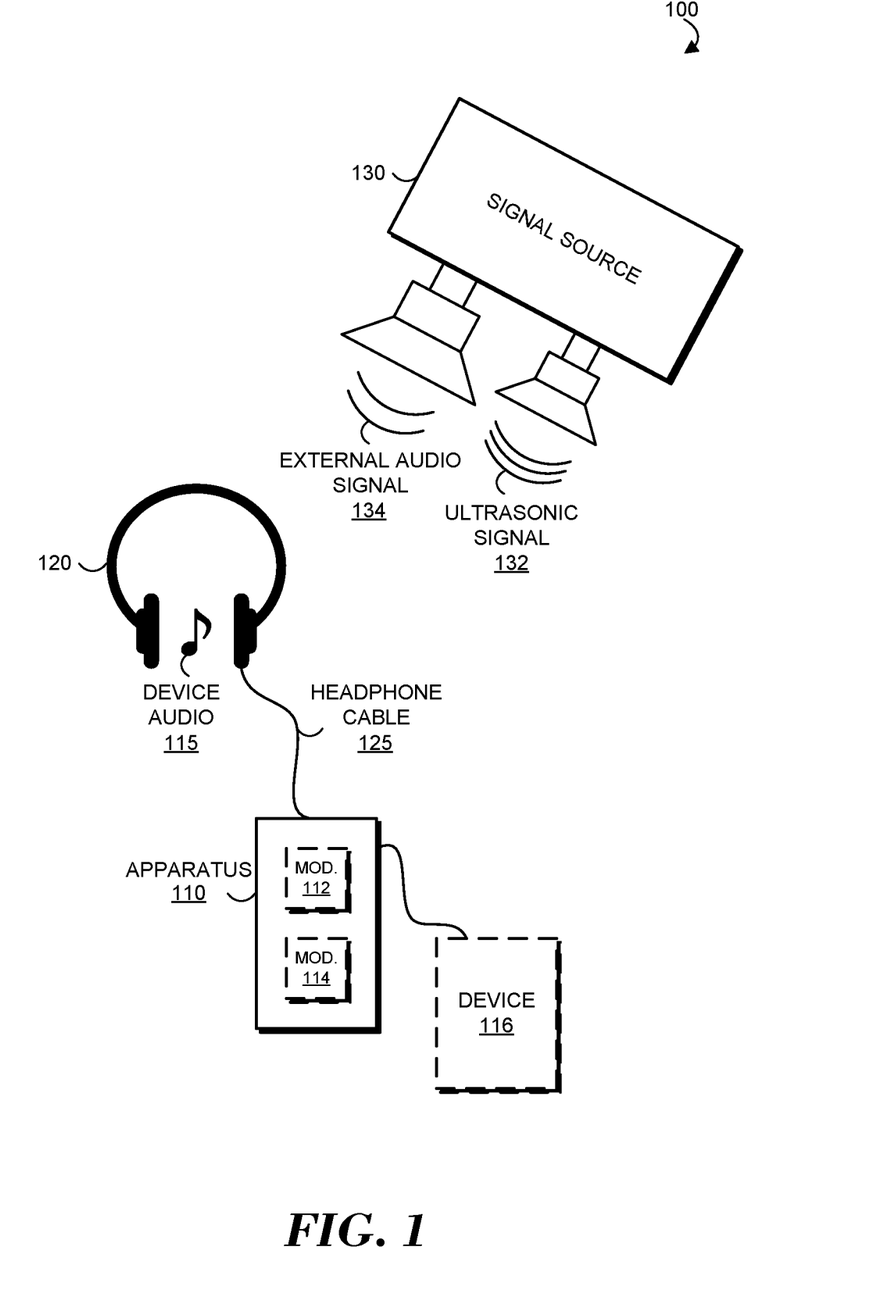
FIG. 1 is an example block diagram of a system according to a possible embodiment.

FIG. 1 is an example block diagram of a system 100 according to a possible embodiment. The system 100 can include an apparatus 110, a headphone 120, and a signal source 130. The apparatus 110 can be a camera phone, a portable wireless communication device, a smartphone, a cellular telephone, a personal digital assistant, a personal computer, a selective call receiver, a tablet computer, a MP3 player, a video player, a media player, or any other device that can provide audio signals to a headphone. The apparatus 110 can also be a module hard wired or otherwise coupled to the headphone 120, such as a module embedded in an earpiece, wirelessly coupled to the headphone 120, coupled to a headphone cable 125 between a headphone speaker and a headphone plug that connects the headphone 120 to another device 116, such as a cellular phone, a smartphone, a MP3 player, or other device that provides device audio, or otherwise coupled to the headphone 120 and/or another device 116.

The headphone 120 can be coupled to the apparatus 110 using a wire or cable 110 or can be wirelessly coupled to the apparatus 110. The headphone 120 can be a single headphone, stereo headphones, an earpiece headphone or headphones, wired headphones, wireless headphones, a headphone including a microphone, and any other headphone that can produce audio signals. The headphone 120 can be coupled wirelessly, hard wired, detachably coupled, or otherwise coupled to the apparatus 110. For example, the headphone 120 can be wirelessly paired with the apparatus 110 using short range wireless communication signals. As another example, the headphone 120 can be detachably coupled to the apparatus 110 using a headphone plug in a port of the apparatus 110.

The signal source 130 can be a public address system, such as on a train, bus, or plane, can be a public address system at an airport, train station, in a convention hall, at an amusement park, at a campground, and/or can be any other public address system. Such a public address system can provide public notifications, such as a notification of which stop is approaching on for bus, can provide captain or flight attendant announcements on a plane, and can provide other public announcements. Such a public address system can also provide emergency announcements, such as fire or tornado warnings, can provide announcements in buildings, and can provide announcements elsewhere. The signal source 130 can also be a source in an ambulance, a fire truck, a police car, or any other source that provides emergency vehicle sounds and/or audible notifications. The signal source 130 can further be any other signal source that provides audio information to a user who may be wearing headphones.

In operation, the apparatus 110 can output device audio 115 at a first device audio setting through the headphone 120 coupled to the apparatus 110. The device audio 115 can be music audio, movie audio, radio audio, podcast audio, multimedia audio, audiobook audio, audio from a telephone call, or any other audio that can be output by a device through a headphone. The apparatus 110 and the device audio source can be the same apparatus. In this example, the apparatus performing the ultrasonic triggered audio reduction functions can be considered an ultrasonic triggered audio reduction software or hardware module 112 and the device audio source can be considered a device audio source software or hardware module 114 in the overall apparatus 110. According to other embodiments, the device audio source can be a device 116 separate from the apparatus 110, where the apparatus 110 performs the ultrasonic triggered audio reduction. Either way, the apparatus 110 can be considered a device audio source because it can provide the device audio 115 itself or it can provide the device audio 115 from another device 116 to the headphone 120.

The apparatus 110 can receive an ultrasonic signal 132. For example, the apparatus 110 can directly receive the ultrasonic signal 132 or can receive the ultrasonic signal via another device 116 coupled to the apparatus 110. The ultrasonic signal 132 can be a signal with a frequency greater than the upper range of human hearing, such as greater than 20 kHz. The apparatus 110 can then reduce device audio volume through the headphone 120 to output the device audio 115 at a second device audio setting through the headphone 120 in response to receiving the ultrasonic signal 132. The apparatus 110 can also disable noise reduction in response to receiving the ultrasonic signal 132. The apparatus 110 can also receive an external audio signal 134 concurrently with or after receiving the ultrasonic signal 132. The apparatus 110 can then send the external audio signal 134 through the headphone 120 further in response to receiving the ultrasonic signal 132.

For example, the level of the device audio 115 can be reduced by the presence of the ultrasonic signal 132, such as triggered by the ultrasonic signal 132. The volume of the device audio 115 can be reduced, such as muted, paused, lowered, or ducked, when the ultrasonic signal 132 is received to allow a user to hear the external audio signal 134. Thus, the device audio 115 can be lowered in the presence of the ultrasonic signal 132 and/or the presence of the external audio signal 134. According to a possible embodiment, the device audio volume level can be lowered while still being audible at a level below a volume level of the external audio signal 134. Such a process can be considered audio ducking that can be done using hardware or software side-chaining of a compressor or limiter, by using a gate with a ducking function, by using digital signal processing on the signals, or by any other method of reducing one audio signal to emphasize another audio signal while mixing the two audio signals together.

Figure 2:
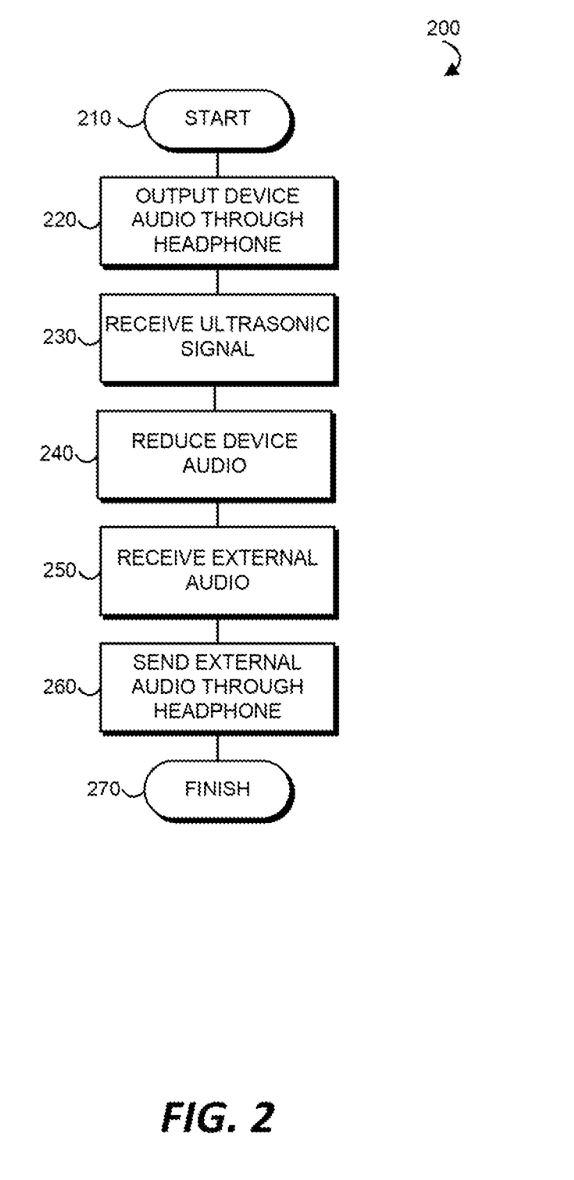
FIG. 2 is an example flowchart illustrating the operation of an apparatus according to a possible embodiment.

FIG. 2 is an example flowchart 200 illustrating the operation of the apparatus 110 according to a possible embodiment. At 210, the flowchart 200 can begin. At 220, device audio can be output at a first device audio setting from a device through a headphone coupled to the device. At 230, an ultrasonic signal can be received. The ultrasonic signal can be received at a device microphone, a microphone on the headphone, a transducer and a device ultrasonic detector separate from the device microphone, and/or any other device that can receive an ultrasonic signal. For example, the microphone that detects the ultrasonic signal can be a normal microphone or can be a microphone specially configured to receive sound with a frequency greater than 20 kHz. The ultrasonic signal can be modulated with another signal. For example, the ultrasonic signal can be modulated with another signal to avoid falsing and interference from other environmental noises, such as to prevent other environmental signals from triggering reduction of the device audio volume through the headphone and prevent other environmental signals from sending external audio signals through the headphone. The ultrasonic signal can be modulated using amplitude modulation, frequency modulation, phase modulation, phase shift keying, frequency shift keying, amplitude shift keying, quadrature amplitude modulation, or other methods of modulation. The sound signature of the received modulated ultrasonic signal can be compared with a predetermined device audio volume reduction signal sound signature and the device audio volume can be reduced when the sound signature of the received modulated ultrasonic signal matches the predetermined device audio volume reduction signal sound signature. The modulated ultrasonic signal can also be demodulated to reduce the device audio volume in response to a sound signature of the demodulated ultrasonic signal matching a predetermined device audio volume reduction signal sound signature.

At 240, device audio volume through the headphone can be reduced to output the device audio at a second device audio setting through the headphone in response to receiving the ultrasonic signal. Reducing device audio volume can include ducking the device audio, pausing playback of the device audio, lowering the device audio, muting the device audio, and/or any other way of reducing device audio volume. At 250, an external audio signal can be received at the device. The external audio signal can be received at a device microphone, a microphone on the headphone, a transducer, or any other device that can receive an external audio signal. The ultrasonic signal and the external audio signal can be from a public announcement system.

At 260, the external audio signal can be sent through the headphone in response to receiving the ultrasonic signal. The external audio signal can be sent through the headphone while continuing to output the device audio at the second device audio setting through the headphone in response to receiving the ultrasonic signal. For example, the device audio at the second device audio setting can be mixed with the external audio signal, such as by adding the external audio into a device audio stream mix, and both can be output through the headphone. The device audio can be reduced in the mix at the second device audio setting so it can still be played in the background while the external audio signal is output through the headphone. At 270, the flowchart 200 can end.

Figure 3:
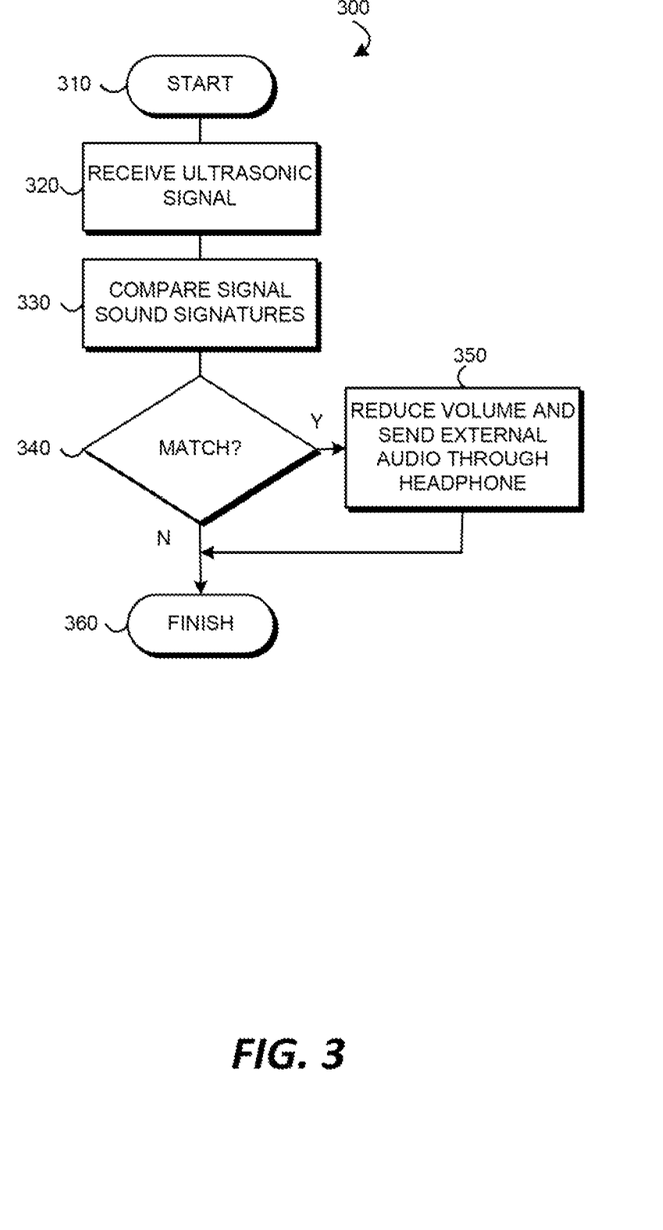
FIG. 3 is an example flowchart illustrating the operation of an apparatus according to a possible embodiment.

FIG. 3 is an example flowchart 300 illustrating the operation of the apparatus 110 according to a possible related embodiment. At 310, the flowchart 300 can begin. At 320, an ultrasonic signal can be received. At 330, a sound signature of the ultrasonic signal can be compared with a predetermined device audio volume reduction signal sound signature. For example, the sound signature can be a frequency of the ultrasonic signal, a modulation of the ultrasonic signal, a pattern of the ultrasonic signal, a pattern within the ultrasonic signal, or any other characteristic of the ultrasonic signal. At 340, if the sound signature of the ultrasonic signal matches a predetermined device audio volume reduction signal sound signature, at 350, the device audio volume through the headphone can be reduced to output the device audio at the second device audio setting through the headphone. At 360, the flowchart 300 can end.

Figure 4:
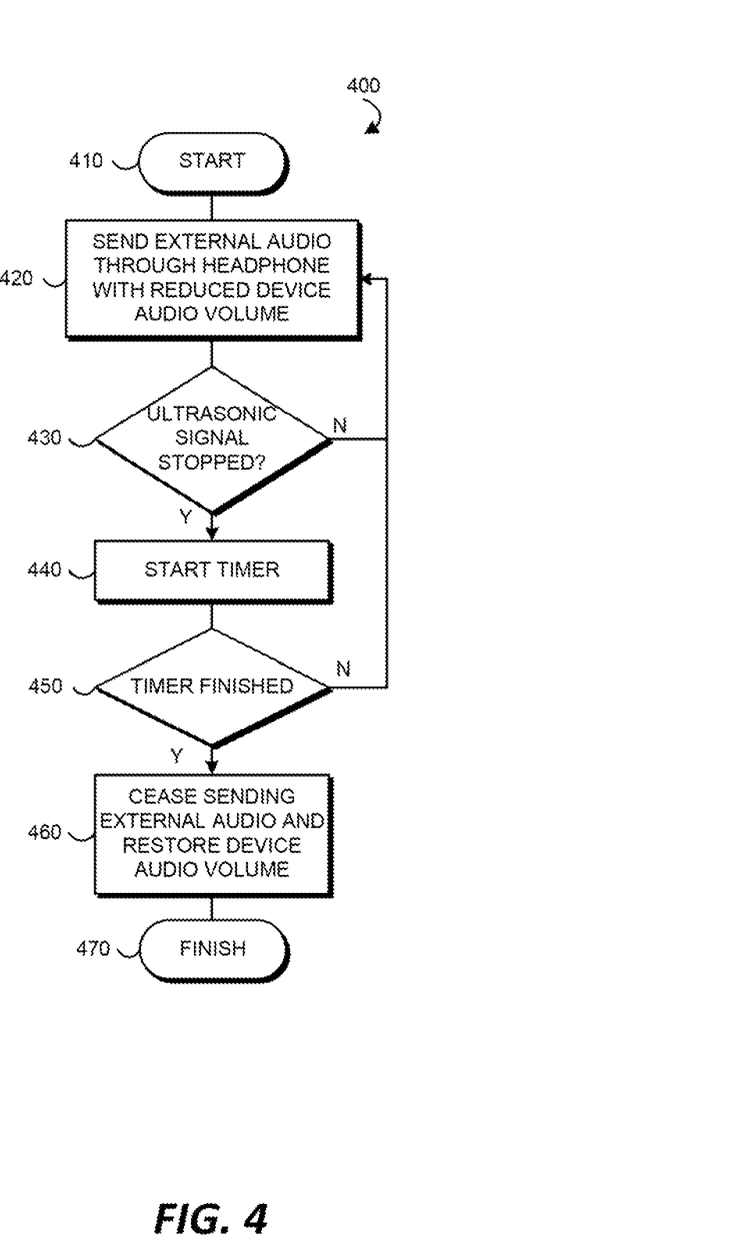
FIG. 4 is an example flowchart illustrating the operation of an apparatus according to a possible embodiment.

FIG. 4 is an example flowchart 400 illustrating the operation of the apparatus 110 according to a possible related embodiment. At 410, the flowchart 400 can begin. At 420, external audio can be sent through a headphone while the device audio volume is reduced, such as after receiving an ultrasonic signal. At 430, if the ultrasonic signal has not stopped and continues to be received, external audio can continue to be sent through the headphone while the device audio volume is reduced at 420. If the ultrasonic signal has stopped being received, at 440 a timer can start to determine if a predetermined time has passed before resuming outputting the device audio at its original setting and ceasing to output the external audio. At 450, if the timer has not finished, the external audio can continue to be sent through the headphone while the device audio volume is reduced at 420. If the ultrasonic signal restarts before the timer finishes, at 430 the external audio can continue to be sent through the headphone while the device audio volume is reduced at 420 until the ultrasonic signal stops being received again at 430. If at 450 the timer has finished, at 460, the external audio can cease through the headphone and the original device audio volume can be restored at the first setting. At 470, the flowchart 400 can end.

According to this embodiment, output of the device audio can be resumed at the first device audio setting after sending the external audio signal through the headphone. Output of the device audio can be resumed at the first device audio setting and the external audio signal can cease being sent through the headphone after a predetermined time period after the ultrasonic signal reception has stopped. If the ultrasonic signal resumes during the predetermined time period after the ultrasonic signal reception has stopped, the reduction of the device audio volume through the headphone can be maintained to output the device audio at the second device audio setting through the headphone and the external audio signal can continue to be sent through the headphone. For example, reception of the ultrasonic signal may stop due to an unintentional temporary dropout of the ultrasonic signal and the reduced device audio volume and sent external audio signal through the headphone can be maintained to avoid unintentional dropouts of the external audio signal and to avoid pumping of the device audio. Thus, the device can wait until the ultrasonic signal has gone away longer than a time period before resuming normal output of the device audio without the external audio signal to carry output of the external audio signal through dropouts of the ultrasonic signal. In essence, hysteresis is employed because the audio output is not only dependent on the current presence or absence of the ultrasonic signal, as it is also dependent on the amount of time since the last detection of the ultrasonic signal. This avoids unwanted rapid switching back and forth of passing of the external audio. Otherwise, a continuous stream of desired external audio may not be continuously passed if there is an accidental lapse of reception of the ultrasonic signal. The change in audio output can then react more slowly to the absence of a recently received ultrasonic signal than it reacts to the presence of a previously absent ultrasonic signal.

According to related embodiments, the volume of the device audio can be raised after a predetermined time, can be raised after the ultrasonic signal has stopped, can be raised after receiving another ultrasonic signal, can be raised after the external audio signal has finished, can be raised after receiving a user input to raise the volume, or after any other useful time or event. While this embodiment describes a countdown timer, such is only for illustrative purposes. For example, a timer can count up to a desired value before restoring the device audio volume. As another example, a device clock can be used to determine when to raise the device audio volume after a predetermined time period.

Figure 5:
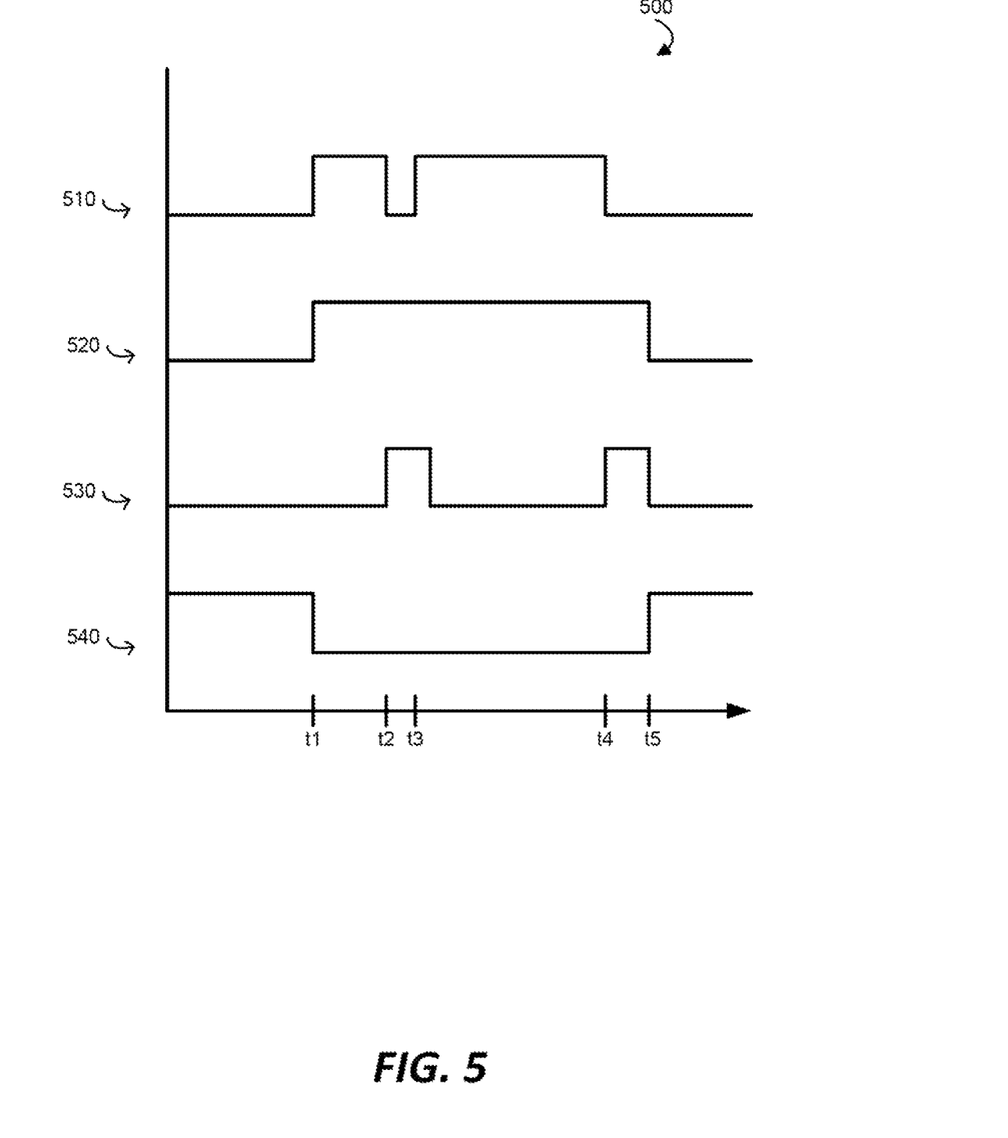
FIG. 5 is an example timing diagram according to a possible embodiment.

FIG. 5 is an example timing diagram 500 according to a possible embodiment. The timing diagram 500 includes ultrasonic signal reception timing 510, external audio headphone output timing 520, device timer timing 530, and device audio volume timing 540. In operation, device audio 540 is output through a headphone at a first volume setting until an ultrasonic signal 510 is received at t1. When the ultrasonic signal 510 is received at t1, the device audio 540 can be reduced and external audio 520 can be output through the headphone. If reception of the ultrasonic signal stops at t2, a timer 530 can start to determine if a predetermined time has passed before ceasing output of the external audio and resuming playback of the device audio at the original setting. If the dropout of the ultrasonic signal 510 was accidental and the signal 510 resumes at t3 before the timer 530 expires, external audio 520 can continue to be output while the device audio 540 is reduced. When reception of the ultrasonic signal 510 stops at t4, the timer 530 can start. If the ultrasonic signal does not resume within a predetermined time period ending at t5, then output of the external audio 520 can cease and playback of the device audio can resume at the original setting. According to an alternate embodiment, the reduction of the device audio and the output of the external audio can be performed for a predetermined time after receiving the ultrasonic signal without dependency on the duration of the ultrasonic signal. According to another alternate embodiment, the ultrasonic signal can trigger device audio reduction and external audio output and another ultrasonic signal can trigger ceasing output of the external audio and trigger resumption of the device audio at its original setting.

Figure 6:
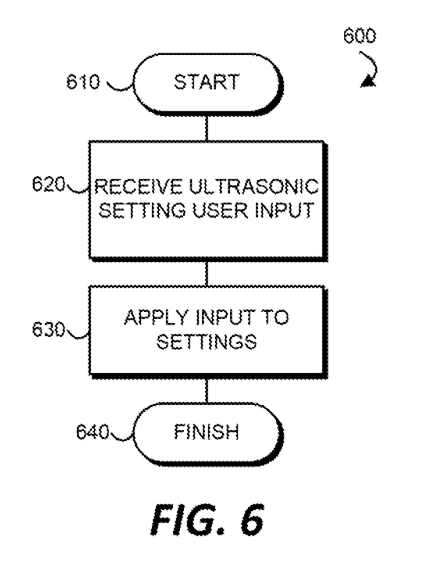
FIG. 6 is an example flowchart illustrating the operation of an apparatus according to a possible embodiment.

FIG. 6 is an example flowchart 600 illustrating the operation of the apparatus 110 according to a possible embodiment. At 610, the flowchart 600 can begin. At 620, user input of a second device audio setting can be received. The second device audio setting can configure operation of the apparatus 110 for when the apparatus 110 receives the ultrasonic signal. For example, the second device audio setting can include a device audio mute setting, a device audio volume reduction setting, a device audio ducking setting, and/or a device audio pause setting. The device audio mute setting can mute the device audio when the ultrasonic signal is received. The device audio volume reduction setting can reduce the device audio volume level when the ultrasonic signal is received and/or can set the level of audio reduction. The device audio ducking setting can duck the device audio when the ultrasonic signal is received. The device audio pause setting can pause playback of the device audio when the ultrasonic signal is received. Thus, the user can configure which type of action the apparatus 110 takes when it receives the ultrasonic signal. At 630, the user input can be applied to the settings of the apparatus 110 so the device audio volume through the headphone can be reduced based on the external audio setting in response to receiving the ultrasonic signal. At 640, the flowchart 600 can end.

Figure 7:
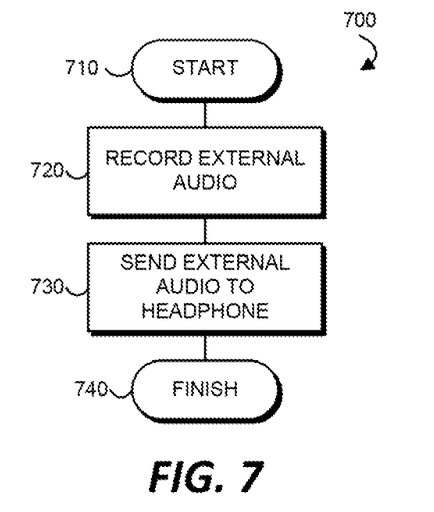
FIG. 7 is an example flowchart illustrating the operation of an apparatus according to a possible embodiment.

FIG. 7 is an example flowchart 700 illustrating the operation of the apparatus 110 according to a possible embodiment. At 710, the flowchart 700 can begin. At 720, an external audio signal received at a microphone can be recorded, such as after an ultrasonic signal is received. At 730, the external audio signal can be sent through a headphone by playing back the recorded external audio signal through the headphone. For example, the external audio signal can be sampled and temporarily stored for sending it through the headphone. Audio loopback can be used to repeat the external audio signal through the headphone separate from the external audio signal heard over the air. At 740, the flowchart 700 can end.

Figure 8:
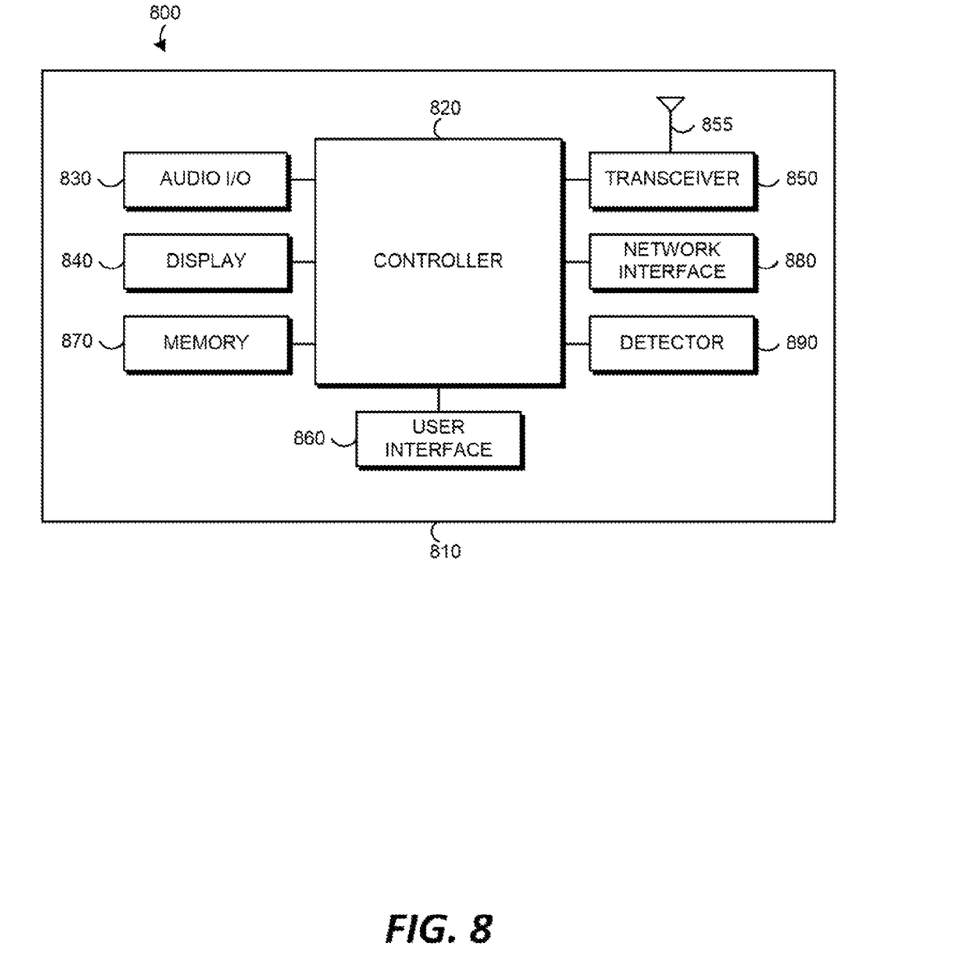
FIG. 8 is an example block diagram of an apparatus according to a possible embodiment.

FIG. 8 is an example block diagram of an apparatus 800, such as the apparatus 110, according to a possible embodiment. The apparatus 800 can include a housing 810, a controller 820 within the housing 810, audio input and output circuitry 830 coupled to the controller 820, a display 840 coupled to the controller 820, a transceiver 850 coupled to the controller 820, an antenna 855 coupled to the transceiver 850, a user interface 860 coupled to the controller 820, a memory 870 coupled to the controller 820, a network interface 880 coupled to the controller 820, and a detector 890 coupled to the controller 820. The apparatus 800 can perform the methods described in all the embodiments.

The display 840 can be a viewfinder, such as a liquid crystal display (LCD), a light emitting diode (LED) display, a plasma display, a projection display, a touch screen, or any other device that displays information. The transceiver 850 may include a transmitter and/or a receiver. The user interface 860 can include a keypad, a keyboard, buttons, a touch pad, a joystick, a touch screen display, another additional display, or any other device useful for providing an interface between a user and an electronic device. The network interface 880 can be a universal serial bus port, an Ethernet port, an infrared transmitter/receiver, an IEEE 1394 port, or any other interface that can connect an apparatus to a network or computer and that can transmit and receive data communication signals. The memory 870 can include a random access memory, a read only memory, an optical memory, a subscriber identity module memory, a flash memory, a removable memory, a hard drive, a cache, or any other memory that can be coupled to a wireless communication device. The audio input and output circuitry 830 can include a microphone, a speaker, a transducer, a headphone port, and/or any other audio input and output circuitry. A microphone of the audio input and output circuitry 830, the detector 890, or both can be used to detect an ultrasonic signal.

The apparatus 800 or the controller 820 may implement any operating system, such as Microsoft Windows®, UNIX®, LINUX®, Android™, or any other operating system. Apparatus operation software may be written in any programming language, such as C, C++, Java or Visual Basic, for example. Apparatus software may also run on an application framework, such as, for example, a Java® framework, a .NET® framework, or any other application framework. The software and/or the operating system may be stored in the memory 870 or elsewhere on the apparatus 800. The apparatus 800 or the controller 820 may also use hardware to implement operations. For example, the controller 820 may be any programmable processor. Disclosed embodiments may also be implemented on a general-purpose or a special purpose computer, a programmed microprocessor or microprocessor, peripheral integrated circuit elements, an application-specific integrated circuit or other integrated circuits, hardware/electronic logic circuits, such as a discrete element circuit, a programmable logic device, such as a programmable logic array, field programmable gate-array, or the like. In general, the controller 820 may be any controller or processor device or devices capable of operating an electronic device and implementing the disclosed embodiments.

In operation, the controller 820 can output device audio from the apparatus 800 through a headphone, such as a headphone coupled to a port of the audio circuitry 830 at a first device audio setting. For example, the controller 820 can output music or video audio stored on the apparatus 800, audio streamed to the apparatus 800, audio from a telephone call, and other device audio. The controller 820 can also output device audio received from another device, such as a smartphone, a media player, a tablet computer, a streaming media source, or other device directly or indirectly coupled to the apparatus 800. Aside from using a port, the headphone can also be coupled to the apparatus 800 using short range communications using a transceiver, such as the transceiver 850 or in addition to the transceiver 850. The headphone can also be hard wired to the apparatus 800.

An ultrasonic signal detector can receive an ultrasonic signal and can send the ultrasonic signal to the controller 820. For example, a dedicated detector 890 and/or a microphone of the audio circuitry 830 can be the ultrasonic signal detector that receives the ultrasonic signal. As a further example, the ultrasonic signal detector can be a device microphone, a microphone on the headphone, a device ultrasonic detector separate from the device microphone. The ultrasonic signal detector can also be a transducer, a sensor, or any other detector that can receive and/or detect an ultrasonic signal. The ultrasonic signal detector and an audio signal detector can use the same device, such as the same microphone, to receive the ultrasonic signal and an external audio signal. The ultrasonic signal detector and the audio signal detector can also be modules coupled to a microphone, a transducer, or any other sensor that can receive signals that propagate through the air. The ultrasonic signal and the external audio signal sent to the controller 820 can be electrical signals and the controller 820 can perform analog-to-digital (A/D) conversion on the signals to process the signals. Alternately, a separate A/D converter can be used to convert the signals from analog to digital for the controller. The signals can also be optical signals, analog signals, or any other signal that can be sent from a detector to a controller.

The controller 820 can reduce device audio volume through the headphone to output the device audio at a second device audio setting through the headphone in response to receiving the ultrasonic signal. According to a possible embodiment, the controller 820 can compare a sound signature of the ultrasonic signal with a predetermined device audio volume reduction signal sound signature. The controller 820 can then reduce the device audio volume through the headphone to output the device audio at the second device audio setting through the headphone when the sound signature of the ultrasonic signal matches the predetermined device audio volume reduction signal sound signature.

An audio signal detector can receive an external audio signal and send the external audio signal to the controller. For example, a microphone of the audio circuitry 830, a microphone on a headphone, and/or another detector 890 can be an audio signal detector that receives the external audio signal. The controller 820 can send the external audio signal through the headphone in response to receiving the ultrasonic signal. According to another possible embodiment, the memory 870 can record the external audio signal received at the audio signal detector and the controller 820 can send the external audio signal through the headphone by playing back the recorded external audio signal through the headphone.

The controller 820 can resume output of the device audio at the first device audio setting and cease sending the external audio signal through the headphone after a predetermined time period after the ultrasonic signal detector stops receiving the ultrasonic signal. The controller 820 can maintain reducing the device audio volume through the headphone to output the device audio at the second device audio setting through the headphone and maintain sending the external audio signal through the headphone if the ultrasonic signal detector resumes receiving the ultrasonic signal during the predetermined time period after the ultrasonic signal detector has stopped receiving the ultrasonic signal.

The user interface 860 can receive user input of a second device audio setting. The second device audio setting can configure operation of the apparatus 800 in response to receiving the ultrasonic signal. For example, the second device audio setting can include a device audio mute setting, a device audio volume reduction setting, a device audio ducking setting, and/or a device audio pause setting. The controller 820 can reduce the device audio volume through the headphone based on the external audio setting in response to receiving the ultrasonic signal.

Disclosed embodiments can provide for a public address system that transmits an ultrasonic signal along with its normal audio band signal. The ultrasonic signal can be used by a portable device as a signal for reducing the device's audio output and for passing through the external audio to headphones. When the device receives the ultrasonic signal, it can reduce the audio of the device and pass environmental audio to the user's ear.

Embodiments can further provide for an ultrasonic sound that is played at the same time as a public address announcement so mobile devices within range of the audio being announced can lower the volume of their currently playing media or other audio so a user can hear the announcement. This can be similar to audio ducking for device applications that want to break into the device audio path, but this can apply to external audio sources. Embodiments can use a device sensor hub for detecting the ultrasonic signal. The sensor hub can use a lower power processor than the main device processor to consume less power if the main processor is idle while using the sensor hub to detect the ultrasonic signal.

Embodiments can use an ultrasonic audio signal to mark times when a mobile device should duck its device audio down so the user can hear a public address announcement. This can be similar to operations for internal audio interruptions, such as when a phone call ringtone ducks music to inform a user of an incoming call. However, this can be for external audio streams, so the music being played can be lowered to allow a user to hear public announcements. These public announcement external sounds can be repeated through the headphones, can be allowed to be heard due to internal media being paused, or can otherwise be provided to a user. Embodiments can use an always on voice/sensor hub to listen for the ultrasonic signal/marker. Software or hardware can perform the audio ducking and possible repeating of the external audio.

The method of this disclosure can be implemented on a programmed processor. However, the controllers, flowcharts, and modules may also be implemented on a general purpose or special purpose computer, a programmed microprocessor or microcontroller and peripheral integrated circuit elements, an integrated circuit, a hardware electronic or logic circuit such as a discrete element circuit, a programmable logic device, or the like. In general, any device on which resides a finite state machine capable of implementing the flowcharts shown in the figures may be used to implement the processor functions of this disclosure.

While this disclosure has been described with specific embodiments thereof, it is evident that many alternatives, modifications, and variations will be apparent to those skilled in the art. For example, various components of the embodiments may be interchanged, added, or substituted in the other embodiments. Also, all of the elements of each figure are not necessary for operation of the disclosed embodiments. For example, one of ordinary skill in the art of the disclosed embodiments would be enabled to make and use the teachings of the disclosure by simply employing the elements of the independent claims. Accordingly, embodiments of the disclosure as set forth herein are intended to be illustrative, not limiting. Various changes may be made without departing from the spirit and scope of the disclosure.

It should be understood that, notwithstanding the particular steps as shown in the figures, a variety of additional or different steps can be performed depending upon the embodiment, and one or more of the particular steps can be rearranged, repeated or eliminated entirely depending upon the embodiment. Also, some of the steps performed can be repeated on an ongoing or continuous basis simultaneously while other steps are performed. Furthermore, different steps can be performed by different elements or in a single element of the disclosed embodiments. Additionally, some or all steps performed in one figure can be performed with some or all of the steps in other figures.

In this document, relational terms such as "first," "second," and the like may be used solely to distinguish one entity or action from another entity or action without necessarily requiring or implying any actual such relationship or order between such entities or actions. The phrase "at least one of" followed by a list is defined to mean one, some, or all, but not necessarily all of, the elements in the list. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a," "an," or the like does not, without more constraints, preclude the existence of additional identical elements in the process, method, article, or apparatus that comprises the element. Also, the term "another" is defined as at least a second or more. The terms "including," "having," and the like, as used herein, are defined as "comprising." Furthermore, the background section is written as the inventor's own understanding of the context of some embodiments at the time of filing and includes the inventor's own recognition of any problems with existing technologies and/or problems experienced in the inventor's own work.

I claim:

1. A method comprising:
    outputting device audio from a device at a first device audio setting through a headphone coupled to the device;
    receiving an ultrasonic signal from a system that is external to the device;
    in response to receiving the ultrasonic signal, reducing a device audio volume through the headphone to output the device audio at a second device audio setting through the headphone;
    receiving an external audio signal from the system that is external to the device; and
    in response to receiving the ultrasonic signal, sending the external audio signal through the headphone.

2. The method of claim 1, wherein reducing the device audio volume comprises at least one of ducking the device audio, pausing playback of the device audio, or muting the device audio.

3. The method of claim 1, further comprising receiving user input of the second device audio setting, wherein the second device audio setting configures operation of the device in response to receiving the ultrasonic signal, wherein the second device audio setting includes at least one of a device audio mute setting, a device audio volume reduction setting, a device audio ducking setting, or a device audio pause setting, and wherein reducing the device audio volume through the headphone in response to receiving the ultrasonic signal is based on the second device audio setting.

4. The method of claim 1, further comprising resuming output of the device audio at the first device audio setting after sending the external audio signal through the headphone.

5. The method of claim 1, further comprising, in response to determining that reception of the ultrasonic signal has stopped, and after a predetermined time period, resuming output of the device audio at the first device audio setting and ceasing sending the external audio signal through the headphone.

6. The method of claim 5, further comprising, in response to determining that reception of the ultrasonic signal has stopped, maintaining reducing the device audio volume through the headphone to output the device audio at the second device audio setting through the headphone and maintaining sending the external audio signal through the headphone if the ultrasonic signal resumes during the predetermined time period.

7. The method of claim 1,
wherein the ultrasonic signal is received at one of a device microphone, a microphone on the headphone, a transducer, or a device ultrasonic detector separate from the device microphone, and
wherein the external audio signal is received at one of a device microphone, a microphone on the headphone, or a transducer.

8. The method of claim 1, further comprising recording, on the device, the external audio signal received at a microphone, wherein sending the external audio signal through the headphone comprises playing back the recorded external audio signal through the headphone.

9. The method of claim 1, wherein sending the external audio signal through the headphone comprises sending the external audio signal through the headphone while continuing to output the device audio at the second device audio setting through the headphone in response to receiving the ultrasonic signal.

10. The method of claim 1, further comprising comparing a sound signature of the ultrasonic signal with a predetermined device audio volume reduction signal sound signature, wherein reducing the device audio volume comprises reducing the device audio volume through the headphone to output the device audio at the second device audio setting through the headphone when the sound signature of the ultrasonic signal matches the predetermined device audio volume reduction signal sound signature.

11. The method of claim 1, wherein receiving the ultrasonic signal comprises receiving the ultrasonic signal modulated with another signal at the device.

12. The method of claim 1, wherein the system that is external to the device comprises a public announcement system.

13. An apparatus comprising:
a controller configured to output device audio from the apparatus through a headphone at a first device audio setting;
an ultrasonic signal detector coupled to the controller, the ultrasonic signal detector configured to receive an ultrasonic signal from a system that is external to the device, and to send the ultrasonic signal to the controller, where the controller is configured, in response to receiving the ultrasonic signal, to reduce a device audio volume through the headphone to output the device audio at a second device audio setting through the headphone;
an audio signal detector coupled to the controller, the audio signal detector configured to receive an external audio signal from the system that is external to the device, and to send the external audio signal to the controller, where the controller is configured, in response to receiving the ultrasonic signal, to send the external audio signal through the headphone.

14. The apparatus of claim 13, further comprising a user interface configured to receive user input of the second device audio setting, wherein the second device audio setting configures operation of the apparatus in response to receiving the ultrasonic signal, wherein the second device audio setting includes at least one of a device audio mute setting, a device audio volume reduction setting, a device audio ducking setting, or a device audio pause setting, and
wherein the controller reduces the device audio volume through the headphone based on the second device audio setting in response to receiving the ultrasonic signal.

15. The apparatus of claim 13, wherein the controller is configured to resume output of the device audio at the first device audio setting and cease sending the external audio signal through the headphone after a predetermined time period after the ultrasonic signal detector stops receiving the ultrasonic signal.

16. The apparatus of claim 15, wherein the controller is configured to maintain reducing the device audio volume through the headphone to output the device audio at the second device audio setting through the headphone and maintain sending the external audio signal through the headphone if the ultrasonic signal detector resumes receiving the ultrasonic signal during the predetermined time period after the ultrasonic signal detector has stopped receiving the ultrasonic signal.

17. The apparatus of claim 13, wherein the ultrasonic signal detector comprises one of a device microphone, a microphone on the headphone, a device ultrasonic detector separate from the device microphone, or a same detector as the audio signal detector.

18. The apparatus of claim 13, further comprising a memory configured to record the external audio signal received at the audio signal detector,
wherein the controller is configured to send the external audio signal through the headphone by playing back the recorded external audio signal through the headphone.

19. The apparatus of claim 13,
wherein the controller is configured to compare a sound signature of the ultrasonic signal with a predetermined device audio volume reduction signal sound signature, and
wherein the controller is configured to reduce the device audio volume through the headphone to output the device audio at the second device audio setting through the headphone when the sound signature of the ultrasonic signal matches the predetermined device audio volume reduction signal sound signature.

20. A method comprising:
outputting device audio at a first device audio setting from a device through a headphone coupled to the device;
receiving an ultrasonic signal at the device;
in response to receiving the ultrasonic signal at the device, reducing a device audio volume through the headphone to output the device audio at a second device audio setting through the headphone;
receiving an external audio signal at the device from a microphone;
in response to receiving the ultrasonic signal at the device, sending the external audio signal through the headphone while continuing to output the device audio at the second device audio setting through the headphone;
in response to determining that reception of the ultrasonic signal has stopped, maintaining reducing the device audio volume through the headphone to output the device audio at the second device audio setting through the headphone and maintaining sending the external audio signal through the headphone if the ultrasonic signal resumes during a predetermined time period; and
in response to determining that the reception of the ultrasonic signal has stopped, and after the predetermined time period, resuming output of the device audio at the first device audio setting.

* * * * *